(12) United States Patent
Song

(10) Patent No.: US 11,961,807 B2
(45) Date of Patent: Apr. 16, 2024

(54) SEMICONDUCTOR PACKAGE

(71) Applicant: SILICON WORKS CO., LTD., Daejeon (KR)

(72) Inventor: Myoung Su Song, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 378 days.

(21) Appl. No.: 17/415,955

(22) PCT Filed: Dec. 18, 2019

(86) PCT No.: PCT/KR2019/017963
§ 371 (c)(1),
(2) Date: Jun. 18, 2021

(87) PCT Pub. No.: WO2020/130609
PCT Pub. Date: Jun. 25, 2020

(65) Prior Publication Data
US 2022/0077080 A1 Mar. 10, 2022

(30) Foreign Application Priority Data

Dec. 20, 2018 (KR) .................. 10-2018-0165786

(51) Int. Cl.
*H01L 23/28* (2006.01)
*H01L 23/00* (2006.01)
(Continued)

(52) U.S. Cl.
CPC ........ *H01L 23/562* (2013.01); *H01L 23/3107* (2013.01); *H01L 23/49568* (2013.01);
(Continued)

(58) Field of Classification Search
CPC ............... H01L 23/562; H01L 23/3107; H01L 23/49568; H01L 24/05; H01L 24/32;
(Continued)

(56) References Cited

U.S. PATENT DOCUMENTS

2015/0338258 A1 11/2015 Kono et al.
2016/0240451 A1 8/2016 Hwang et al.
(Continued)

FOREIGN PATENT DOCUMENTS

JP 2014-134519 A 7/2014
JP 5832557 B2 12/2015
(Continued)

OTHER PUBLICATIONS

International Search Report from corresponding PCT Application No. PCT/KR2019/017963, dated Apr. 3, 2020.

*Primary Examiner* — Paul Dinh
(74) *Attorney, Agent, or Firm* — ROTHWELL, FIGG, ERNST & MANBECK, P.C.

(57) ABSTRACT

The present invention provides a semiconductor package, comprising: a support part; a semiconductor chip provided on the support part and including a plurality of signal pads; a buffer layer provided on the semiconductor chip; an adhesive layer provided on the buffer layer; a pressure-reducing layer provided on the adhesive layer; and a mold layer provided on the pressure-reducing layer.

22 Claims, 6 Drawing Sheets

(51) Int. Cl.
*H01L 23/31* (2006.01)
*H01L 23/495* (2006.01)
*H02J 7/00* (2006.01)

(52) U.S. Cl.
CPC ........ *H02J 7/007182* (2020.01); *H01L 24/05* (2013.01); *H01L 24/32* (2013.01); *H01L 24/48* (2013.01); *H01L 24/49* (2013.01); *H01L 24/73* (2013.01); *H01L 2224/04042* (2013.01); *H01L 2224/32245* (2013.01); *H01L 2224/48091* (2013.01); *H01L 2224/48247* (2013.01); *H01L 2224/49171* (2013.01); *H01L 2224/73265* (2013.01); *H02J 7/0014* (2013.01); *H02J 7/00302* (2020.01); *H02J 7/00306* (2020.01); *H02J 7/00309* (2020.01); *H02J 7/0048* (2020.01); *H02J 7/005* (2020.01)

(58) Field of Classification Search
CPC ......... H01L 24/48; H01L 24/49; H01L 24/73; H01L 2224/04042; H01L 2224/32245; H01L 2224/48091; H01L 2224/48247; H01L 2224/49171; H01L 2224/73265; H01L 23/49541; H01L 23/49575; H01L 25/18; H01L 2924/181; H02J 7/007182; H02J 7/0014; H02J 7/00302; H02J 7/00306; H02J 7/00309; H02J 7/0048; H02J 7/005; H01M 10/486; H01M 10/482; H01M 2010/4271; H01M 10/425; Y02E 60/10
USPC .......................................................... 320/162
See application file for complete search history.

(56) References Cited

U.S. PATENT DOCUMENTS

2020/0066653 A1* 2/2020 Kamphuis ............. H01L 23/562
2022/0020711 A1* 1/2022 Chu ........................ H01L 24/05

FOREIGN PATENT DOCUMENTS

| KR | 10-2011-0050231 A | 5/2011 |
| KR | 10-2012-0016925 A | 2/2012 |
| KR | 10-2013-0123682 A | 11/2013 |

\* cited by examiner

SEMICONDUCTOR PACKAGE

CROSS-REFERENCE TO RELATED APPLICATIONS

This application is a national phase application of PCT Application No. PCT/KR2019/017963, filed on Dec. 18, 2019, which claims priority to Korean Patent Application No. 10-2018-0165786, filed on Dec. 20, 2018. The entire disclosures of the applications identified in this paragraph are incorporated herein by references.

TECHNICAL FIELD

The present invention relates to a semiconductor package.

BACKGROUND ART

A semiconductor package is mounted on a substrate and manufactured in various types of semiconductor devices.

Such a semiconductor package includes a semiconductor chip and a mold layer formed on the semiconductor chip.

A large number of circuit elements that perform a predetermined function are formed in the semiconductor chip.

The mold layer is formed on an upper surface of the semiconductor chip to protect the semiconductor chip. The mold layer is formed on the upper surface of the semiconductor chip under high pressure, and therefore, a high pressure is applied to the semiconductor chip in a process of forming the mold layer.

However, when a high pressure is applied to the semiconductor chip during the manufacturing process, the high pressure is transmitted to the circuit element formed in the semiconductor chip, and thus the electrical characteristics of the circuit element may be changed. More specifically, when a high pressure is applied to the circuit element, a signal error may occur in the circuit element due to occurrence of a piezoelectric phenomenon.

SUMMARY

Technical Problem

The present invention is directed to providing a semiconductor package capable of reducing occurrence of a piezoelectric phenomenon in a circuit element of a semiconductor chip in a process of forming a mold layer.

The problems to be solved according to embodiments of the present invention are not limited to the above-mentioned technical problems, and other technical problems not mentioned will be clearly understood by those skilled in the art from the following description.

Technical Solution

An embodiment of the present invention provides a semiconductor package including: a support part; a semiconductor chip provided on the support part and including a plurality of signal pads; a buffer layer provided on the semiconductor chip; an adhesive layer provided on the buffer layer; a pressure-reducing layer provided on the adhesive layer; and a mold layer provided on the pressure-reducing layer.

Another embodiment of the present invention provides a semiconductor package including: a support part; a first semiconductor chip and a second semiconductor chip provided on the support part and each including a plurality of signal pads; a plurality of electrode pads provided to be spaced apart from the support part outside the support part; a wire including a first wire connecting one of the signal pads of the first semiconductor chip and one of the signal pads of the second semiconductor chip, a second wire connecting another signal pad of the first semiconductor chip and one of the electrode pads, and a third wire connecting another signal pad of the second semiconductor chip and another electrode pad; a buffer layer provided on the first semiconductor chip; an adhesive layer provided on the buffer layer; a pressure-reducing layer provided on the adhesive layer; and a mold layer provided on the pressure-reducing layer.

The present invention also provides a battery management system including the above-described semiconductor package, wherein the second semiconductor chip is provided with a voltage sensing unit, and the first semiconductor chip is provided with a microcontroller that receives a sensing voltage from the voltage sensing unit and converts the sensing voltage into voltage information data that is digital data to transmit the voltage information data to a master controller.

Advantageous Effects

According to an embodiment of the present invention, a pressure-reducing layer is formed on a semiconductor chip, and thus pressure applied to a circuit element formed in the semiconductor chip can be reduced, and a signal error of the circuit element due to a piezoelectric phenomenon can be minimized. In addition, according to an embodiment of the present invention, a buffer layer is further provided between the semiconductor chip and the pressure-reducing layer, and thus the pressure applied to the circuit element formed in the semiconductor chip can be minimized, and the signal error of the circuit element due to the piezoelectric phenomenon can be minimized.

DETAILED DESCRIPTION

Figure 1:
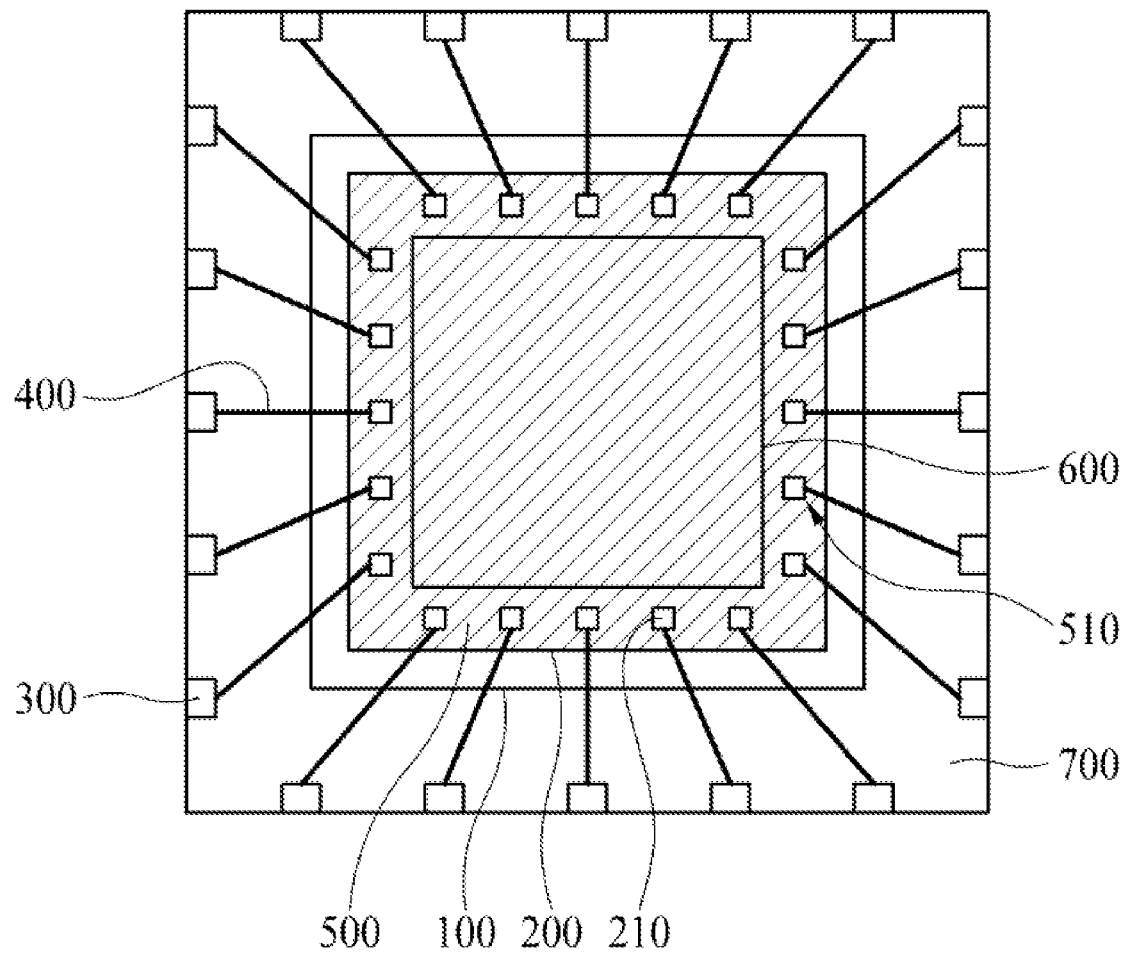
FIG. 1 is a schematic top view of a semiconductor package according to an embodiment of the present invention.

Throughout the specification, the same reference numerals refer to substantially the same components. In the following description, when it is determined that a detailed description of a well-known function or configuration related to the present invention may unnecessarily obscure the gist of the present invention, the detailed description thereof is omitted. In addition, the component names used in the following description may be selected in consideration of the ease of writing the specification and may be different from the actual product part names.

Advantages and features of the present invention and methods for achieving them will be apparent with reference to the embodiments described below in detail with reference to the accompanying drawings. However, the present invention is not limited to the embodiments disclosed below but will be implemented in various forms, and only the embodiments of the present invention make the disclosure of the present invention complete, and are provided to fully convey the scope of the present invention to those skilled in the art to which the present invention belongs, and the present invention is defined only by the scope of the claims.

The shapes, sizes, ratios, angles, numbers, etc. disclosed in the drawings for describing the embodiments of the present invention are exemplary, and thus the present invention is not limited to the illustrated matters. The same reference numerals refer to the same components throughout the specification. In addition, in the description of the present invention, when it is determined that a detailed description of a well-known related technology may unnecessarily obscure the gist of the present invention, the detailed description thereof will be omitted.

In interpreting the component, it is to be construed as including the error range even though there is no other explicit description.

Each of the features of the various embodiments of the present invention may be partially or wholly coupled to or combined with each other, various interlocking and driving are technically possible, and each of the embodiments may be independently performed with respect to each other or may be performed together in an associational relationship.

Hereinafter, preferred embodiments of the present specification will be described in detail with reference to the accompanying drawings.

FIG. 1 is a schematic top view of a semiconductor package according to an embodiment of the present invention.

As can be seen in FIG. 1, the semiconductor package according to an embodiment of the present invention includes a support part 100, a semiconductor chip 200, a plurality of electrode pads 300, a plurality of wires 400, a buffer layer 500, a pressure-reducing layer 600, and a mold layer 700.

The support part 100 supports the semiconductor chip 200. The support part 100 is provided to have an area greater than that of the semiconductor chip 200 while overlapping the semiconductor chip 200. The support part 100 may be formed in a shape corresponding to the semiconductor chip 200. For example, when the semiconductor chip 200 is formed in a predetermined quadrangular shape, the support part 100 may be formed in a quadrangular shape corresponding to the semiconductor chip 200, but the present invention is not limited thereto.

The support part 100 may additionally perform a heat dissipation function, and to this end, the support part 100 may be made of a metal material having an excellent heat dissipation effect, such as copper (Cu).

The semiconductor chip 200 may be disposed in a central region of the semiconductor package. The semiconductor chip 200 may be formed of various driving chips for driving a display device, but the present invention is not limited thereto.

The semiconductor chip 200 is provided with a plurality of signal pads 210. The plurality of signal pads 210 are arranged to be spaced apart from each other in an outer region of the semiconductor chip 200. The plurality of signal pads 210 include a plurality of input signal pads for inputting various signals supplied from an external device to a circuit element in the semiconductor chip 200 and a plurality of output signal pads for outputting various signals generated by the circuit element in the semiconductor chip 200 to the external device. The types and positions of the input signal pads and the output signal pads may be changed in various forms known in the art.

The plurality of electrode pads 300 are disposed to be spaced apart from each other in an outer region of the semiconductor package. The plurality of electrode pads 300 may be formed in a number corresponding to the number of the plurality of signal pads 210 of the semiconductor chip 200, but the present invention is not limited thereto. Like the plurality of signal pads 210, the plurality of electrode pads 300 may include a plurality of input electrode pads and a plurality of output electrode pads.

The plurality of wires 400 electrically connect the plurality of signal pads 210 of the semiconductor chip 200 and the plurality of electrode pads 300. One signal pad 210 and one electrode pad 300 may be electrically connected one-to-one by the wire 400. However, the present invention is not limited thereto, and one wire 400 connected to one signal pad 210 may also be electrically connected to the plurality of electrode pads 300, and the plurality of wires 400 respectively connected to the plurality of signal pads 210 may also be electrically connected to one electrode pad 300.

The buffer layer 500 is formed on the semiconductor chip 200. The buffer layer 500 may be formed to have a shape corresponding to a shape of the semiconductor chip 200. In particular, the outermost line of the buffer layer 500 may be consistent with the outermost line of the semiconductor chip 200. However, the buffer layer 500 is provided with a plurality of first open regions 510 in order to allow the signal pad 210 of the semiconductor chip 200 to be exposed to the outside. That is, the plurality of first open regions 510 may be formed in a shape corresponding to the plurality of signal pads 210 at positions corresponding to the plurality of signal pads 210.

The buffer layer 500 is provided between the semiconductor chip 200 and the pressure-reducing layer 600 to block a lower surface of the pressure-reducing layer 600 from directly coming into contact with an upper surface of the semiconductor chip 200. Thus, according to an embodiment of the present invention, the buffer layer 500 is further provided between the semiconductor chip 200 and the pressure-reducing layer 600, and thus the pressure applied to the circuit element formed in the semiconductor chip 200 is minimized, and a signal error of the circuit element due to a piezoelectric phenomenon may be minimized.

Meanwhile, the buffer layer 500 may also serve to protect a peripheral region of the semiconductor chip 200 that does not overlap the pressure-reducing layer 600. The buffer layer 500 may be made of an insulating material, and in particular, it may be made of an organic insulating material such as polyimide in terms of a buffer effect.

The pressure-reducing layer 600 may be formed to have a shape corresponding to the semiconductor chip 200 while overlapping the semiconductor chip 200, but the present invention is not limited thereto. The pressure-reducing layer 600 is formed on the semiconductor chip 200, and the pressure-reducing layer 600 is formed so as not to overlap the plurality of signal pads 210 in order to allow the plurality of signal pads 210 of the semiconductor chip 200 to be exposed to the outside. Therefore, the pressure-reducing layer 600 may be formed in an inner region than the plurality of signal pads 210 while having an area smaller than that of the semiconductor chip 200.

The pressure-reducing layer 600 serves to absorb high pressure generated when forming the mold layer 700 or to block the high pressure from being directly applied to the semiconductor chip 200. As described above, according to an embodiment of the present invention, the pressure applied to the circuit element formed in the semiconductor chip 200 is reduced by forming the pressure-reducing layer 600 on the semiconductor chip 200, and thus the signal error of the circuit element due to the piezoelectric phenomenon may be minimized.

Since the pressure-reducing layer 600 is formed on the semiconductor chip 200, when a difference between a deformation of the pressure-reducing layer 600 and a deformation of the semiconductor chip 200 at a high temperature becomes large, a problem that the semiconductor chip 200 is distorted may occur due to the pressure-reducing layer 600. When considering this point, it may be preferable that a deviation between a thermal expansion coefficient of the pressure-reducing layer 600 and a thermal expansion coefficient of the semiconductor chip 200 is within ±10. For example, when considering the thermal expansion coefficient of the semiconductor chip 200 made of a silicon wafer, it may be preferable that the thermal expansion coefficient of the pressure-reducing layer 600 is 2.6 ppm/° C. to 3.0 ppm/° C. In particular, most preferably, the thermal expansion coefficient of the pressure-reducing layer 600 and the thermal expansion coefficient of the semiconductor chip 200 are the same, and in this case, the pressure-reducing layer 600 may be made of the same material as the semiconductor chip 200. For example, the pressure-reducing layer 600 may be made of an unprocessed silicon wafer in which a circuit element forming process is not performed.

The mold layer 700 may be formed to define an outer shape of the semiconductor package. The mold layer 700 may be made of various materials known in the art.

Figure 2:
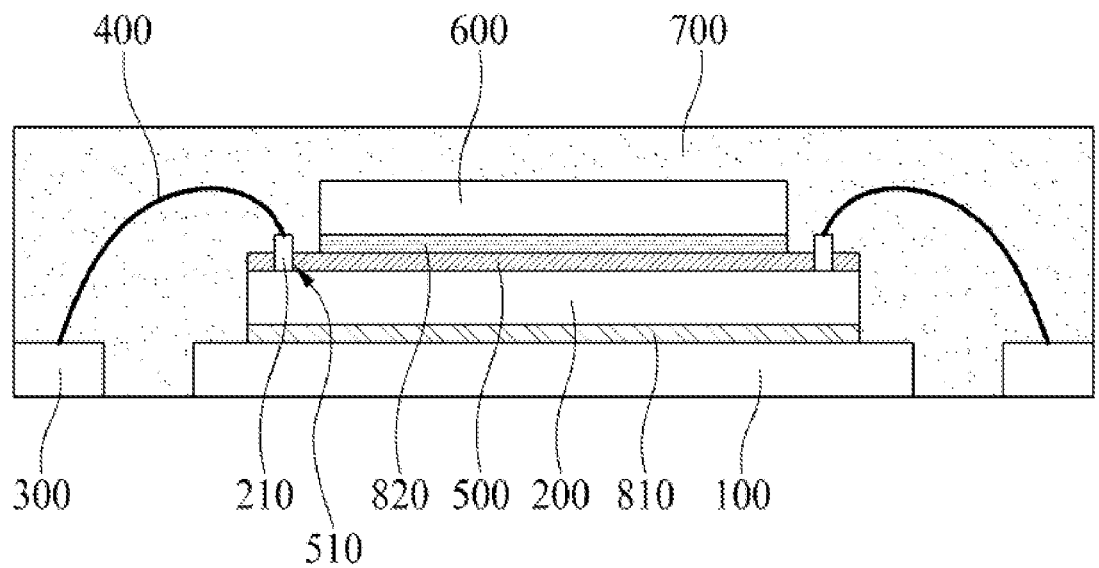
FIG. 2 is a schematic cross-sectional view of a semiconductor package according to an embodiment of the present invention.

FIG. 2 is a schematic cross-sectional view of a semiconductor package according to an embodiment of the present invention.

As can be seen in FIG. 2, the semiconductor package according to an embodiment of the present invention includes a support part 100, a semiconductor chip 200, a plurality of electrode pads 300, a plurality of wires 400, a buffer layer 500, a pressure-reducing layer 600, a mold layer 700, and adhesive layers 810 and 820.

The support part 100 is provided below the semiconductor chip 200 to support the semiconductor chip 200. Although not shown, a heat sink may be additionally configured on a lower surface of the support part 100 to more easily dissipate heat generated from the semiconductor chip 200 to the outside.

The semiconductor chip 200 is formed on the support part 100 and is fixed to an upper surface of the support part 100 by a first adhesive layer 810. A plurality of signal pads 210 are formed in an outer region of an upper surface of the semiconductor chip 200. The plurality of signal pads 210 are electrically connected to the plurality of electrode pads 300 through the plurality of wires 400. Therefore, upper surfaces of the plurality of signal pads 210 are exposed without being covered by the buffer layer 500 for connection with the plurality of wires 400.

The plurality of electrode pads 300 are disposed to be spaced apart from each other in a peripheral region of the semiconductor package. That is, the plurality of electrode pads 300 are provided to be spaced apart from the support part 100 outside the support part 100. In particular, the plurality of electrode pads 300 may be disposed on the outermost line of the semiconductor package. The plurality of electrode pads 300 may be disposed at the same height as the support part 100, but the present invention is not limited thereto.

The plurality of wires 400 connect between the plurality of signal pads 210 of the semiconductor chip 200 and the plurality of electrode pads 300. That is, one end of each of the wires 400 is connected to each of the plurality of signal pads 210, and the other end of each of the wires 400 is connected to each of the electrode pads 300.

The buffer layer 500 is provided on the upper surface of the semiconductor chip 200. A lower surface of the buffer layer 500 is in contact with the upper surface of the semiconductor chip 200.

The buffer layer 500 may be formed on the entire upper surface of the semiconductor chip 200 except for regions overlapping the plurality of signal pads 210. That is, the buffer layer 500 is provided with a first open region 510 in a region of each of the plurality of signal pads 210 so that the plurality of signal pads 210 may be exposed. The first open region 510 is formed to pass through from an upper surface to the lower surface of the buffer layer 500. In addition, one end of the buffer layer 500, for example, a left end thereof, may be consistent with one end of the semiconductor chip 200, for example, a left end thereof, and the other end of the buffer layer 500, for example, a right end thereof, may be consistent with the other end of the semiconductor chip 200, for example, a right end thereof.

In order to facilitate the connection between the plurality of signal pads 210 and the plurality of wires 400, a thickness of the buffer layer 500 may be configured to be smaller than a thickness of the signal pad 210, and accordingly, at least a part of the signal pad 210 is exposed to the outside of the buffer layer 500, and the upper surface of the signal pad 210 may be formed at a position higher than the upper surface of the buffer layer 500.

The pressure-reducing layer 600 is formed on the buffer layer 500 and is fixed to the upper surface of the buffer layer 500 by a second adhesive layer 820. The pressure-reducing layer 600 is formed so as not to overlap the plurality of signal pads 210. Therefore, one end of the pressure-reducing layer 600, for example, a left end thereof, is not consistent with one end of each of the buffer layer 500 and the semiconductor chip 200, for example, the left end thereof, and the other end of the pressure-reducing layer 600, for example, a right end thereof, is not consistent with the other end of each of the buffer layer 500 and the semiconductor chip 200, for example, the right end thereof.

In order to absorb high pressure generated when forming the mold layer 700 or to block the high pressure from being directly applied to the semiconductor chip 200, it is preferred that the pressure-reducing layer 600 has a predetermined thickness. It may be preferable that the pressure-reducing layer 600 has a thickness of half of a thickness of the semiconductor chip 200 or more. In addition, as the thickness of the pressure-reducing layer 600 increases, the absorption or blocking effect of the high pressure may increase, but when the thickness of the pressure-reducing layer 600 increases too much, the thickness of the semiconductor package becomes too thick, which is not preferable. When considering this point, it may be preferable that the thickness of the pressure-reducing layer 600 is equal to or less than the thickness of the semiconductor chip 200. When considering a thickness range of the conventional general semiconductor chip 200, it may be preferable that the thickness of the pressure-reducing layer 600 ranges from 200 μm to 500 μm.

The mold layer 700 is formed on the support part 100, the semiconductor chip 200, the plurality of electrode pads 300, the plurality of wires 400, the buffer layer 500, and the pressure-reducing layer 600. The mold layer 700 may be formed through a high-pressure injection process.

The adhesive layers 810 and 820 include the first adhesive layer 810 and the second adhesive layer 820. The first adhesive layer 810 is provided between the support part 100 and the semiconductor chip 200 to adhere the support part 100 and the semiconductor chip 200. The second adhesive layer 820 is provided between the buffer layer 500 and the pressure-reducing layer 600 to adhere the buffer layer 500 and the pressure-reducing layer 600.

The second adhesive layer 820 is formed so as not to overlap the plurality of signal pads 210. Therefore, one end of the second adhesive layer 820, for example, a left end thereof, is not consistent with one end of each of the buffer layer 500 and the semiconductor chip 200, for example, the left end thereof, and the other end of the second adhesive layer 820, for example, a right end thereof, is not consistent with the other end of each of the buffer layer 500 and the semiconductor chip 200, for example, the right end thereof. The second adhesive layer 820 may be formed in the same pattern as the pressure-reducing layer 600.

Figure 3:
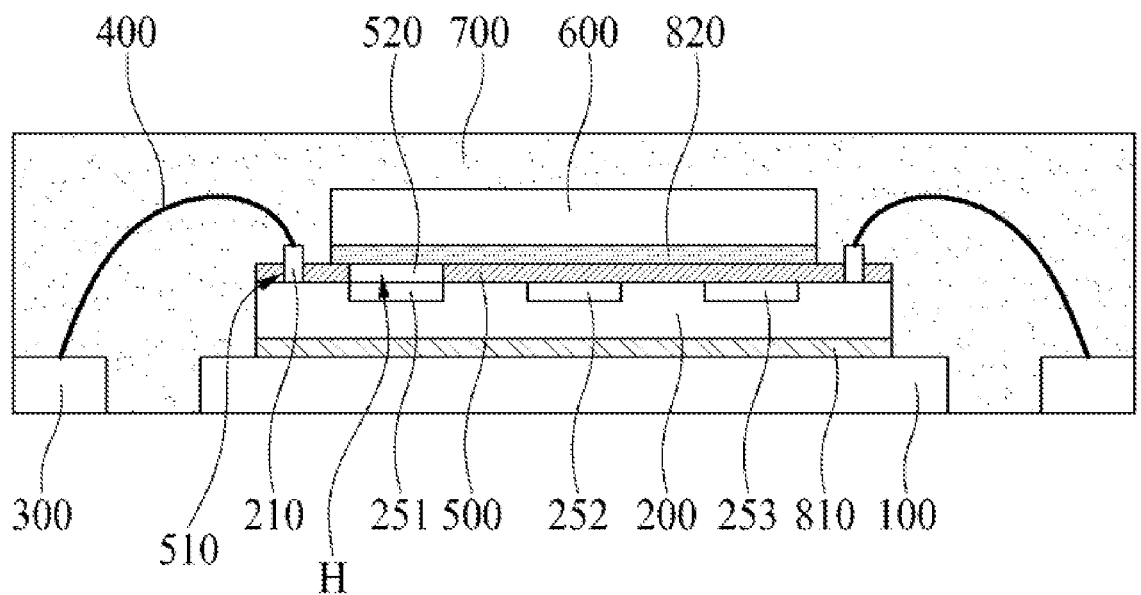
FIG. 3 is a schematic cross-sectional view of a semiconductor package according to another embodiment of the present invention.

FIG. 3 is a schematic cross-sectional view of a semiconductor package according to another embodiment of the present invention, which is different from the semiconductor package according to FIG. 2 described above in that the configuration of the buffer layer 500 is changed. Therefore, the same reference numerals are assigned to the same configuration, and different configurations will be described below.

As can be seen in FIG. 3, a semiconductor chip 200 is provided with a first circuit region 251, a second circuit region 252, and a third circuit region 253. The first circuit region 251, the second circuit region 252, and the third circuit region 253 are circuit regions formed inside the semiconductor chip 200 and are composed of circuit elements that perform different functions according to the semiconductor chip 200. Meanwhile, although only the first to third circuit regions 251, 252, and 253 are shown in the drawing, the semiconductor chip 200 may be additionally provided with more circuit regions.

The first circuit region 251 is provided with a circuit element that reacts sensitively to external pressing force and thus has a high possibility of generating a signal error due to a piezoelectric phenomenon, and the second circuit region 252 and the third circuit region 253 are provided with circuit elements that do not react sensitively to external pressing force and thus have a small or no possibility of generating the signal error due to the piezoelectric phenomenon. Specifically, a band gap reference circuit or an amplifier circuit may be provided in the first circuit region 251, and the second circuit region 252 and the third circuit region 253 may be provided with other circuits.

A buffer layer 500 provided on an upper surface of the semiconductor chip 200 includes a first open region 510 in a region corresponding to the signal pad 210 and a second open region 520 in a region corresponding to the first circuit region 251. Like the first open region 510, the second open region 520 is formed to pass through from an upper surface to a lower surface of the buffer layer 500.

As the buffer layer 500 includes the second open region 520, a pore H may be formed in a space between the buffer layer 500, the second adhesive layer 820, and the semiconductor chip 200. When a solid adhesive film is used as the second adhesive layer 820, the second open region 520 may be left without being filled with the second adhesive layer 820, and accordingly, the second open region 520 may remain as the pore H. That is, the pore H may be a space defined by the buffer layer 500, the second adhesive layer 820, and the semiconductor chip 200.

As described above, according to another embodiment of the present invention, since the buffer layer 500 includes the second open region 520, when the mold layer 700 is formed, the pressure applied directly to the first circuit region 251 corresponding to the second open region 520 may be reduced, and accordingly, the signal error due to the piezoelectric phenomenon in the first circuit region 251 may be further reduced.

Figure 4:
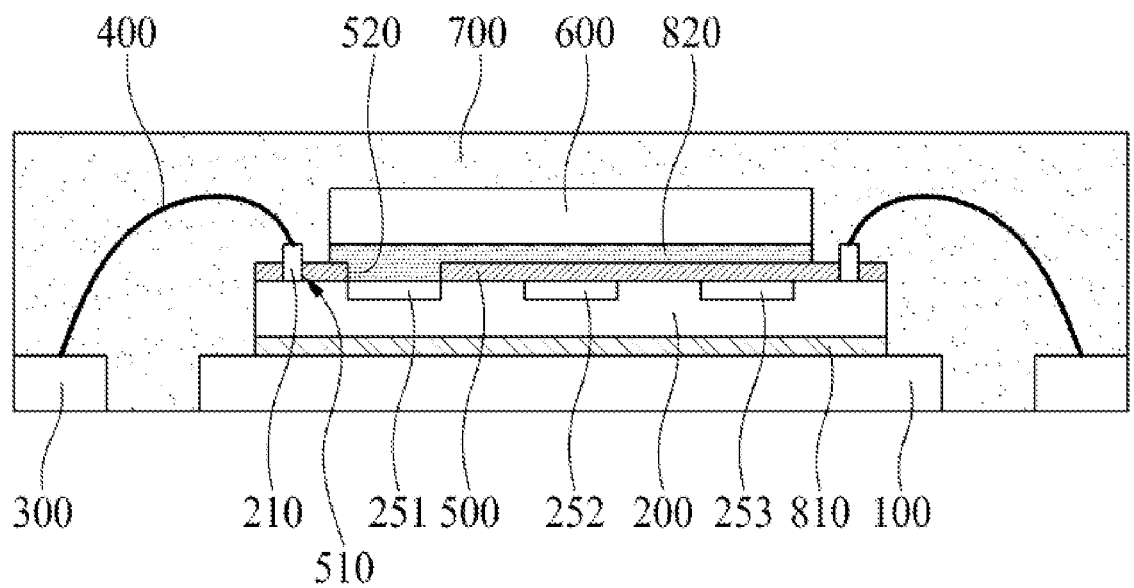
FIG. 4 is a schematic cross-sectional view of a semiconductor package according to still another embodiment of the present invention.

FIG. 4 is a schematic cross-sectional view of a semiconductor package according to still another embodiment of the present invention, which is different from FIG. 3 described above in that the pore H is not formed in the second open region 520. Therefore, the same reference numerals are assigned to the same configuration, and different configurations will be described below.

According to FIG. 4, a buffer layer 500 includes a second open region 520 in a region corresponding to a first circuit region 251. At this time, when a second adhesive layer 820 formed on the buffer layer 500 has a predetermined viscosity and a thickness greater than that of the buffer layer 500, the second open region 520 may be filled with the second adhesive layer 820 due to the pressure applied from an upper side when the mold layer 700 is formed, and accordingly, the pore H is not formed in the second open region 520.

When the pore H is not formed in the second open region 520 and is filled with the second adhesive layer 820, the adhesive force between the semiconductor chip 200 and the pressure-reducing layer 600 may be more excellent, and there is an advantage that a problem of expansion or contraction of the pore H does not occur in the future.

Figure 5:
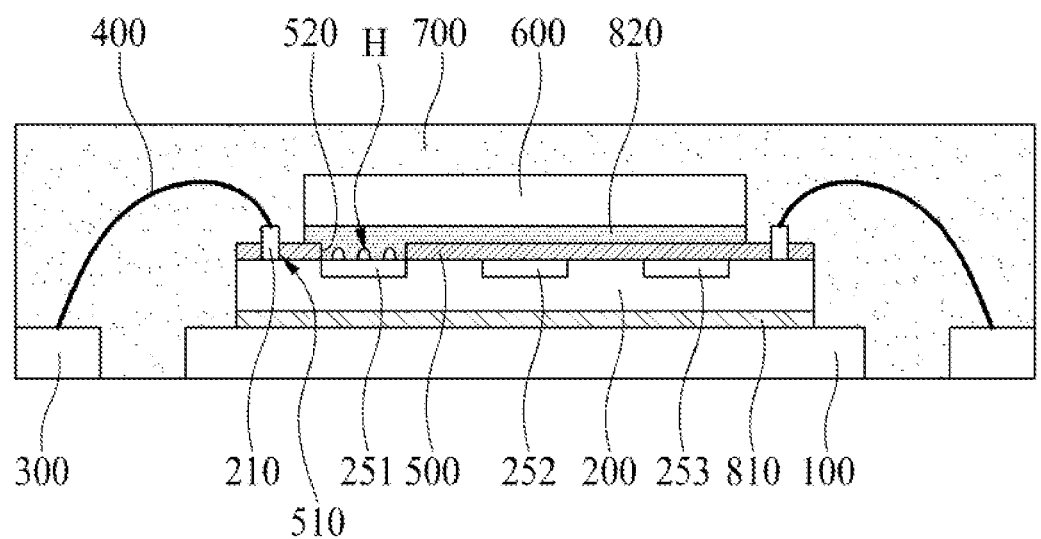
FIG. 5 is a schematic cross-sectional view of a semiconductor package according to still another embodiment of the present invention.

FIG. 5 is a schematic cross-sectional view of a semiconductor package according to still another embodiment of the present invention, which is different from FIGS. 3 and 4 described above in that a part of the second open region 520 is filled with the second adhesive layer 820 and at least one pore H is formed in the remaining part of the second open region 520. Therefore, the same reference numerals are assigned to the same configuration, and different configurations will be described below.

According to FIG. 5, a buffer layer 500 includes a second open region 520 in a region corresponding to a first circuit region 251. At this time, when a second adhesive layer 820 formed on the buffer layer 500 has a predetermined viscosity and a thickness greater than that of the buffer layer 500, the second open region 520 may be filled with the second adhesive layer 820 due to the pressure applied from an upper side when the mold layer 700 is formed.

However, the entirety of the second open region 520 may not be filled with the second adhesive layer 820, but a part of the second open region 520 may be filled. Accordingly, at least one fine pore H may be formed in the remaining part of the second open region 520. The fine pore H may be formed in a space between the second adhesive layer 820 and the semiconductor chip 200.

Figure 6:
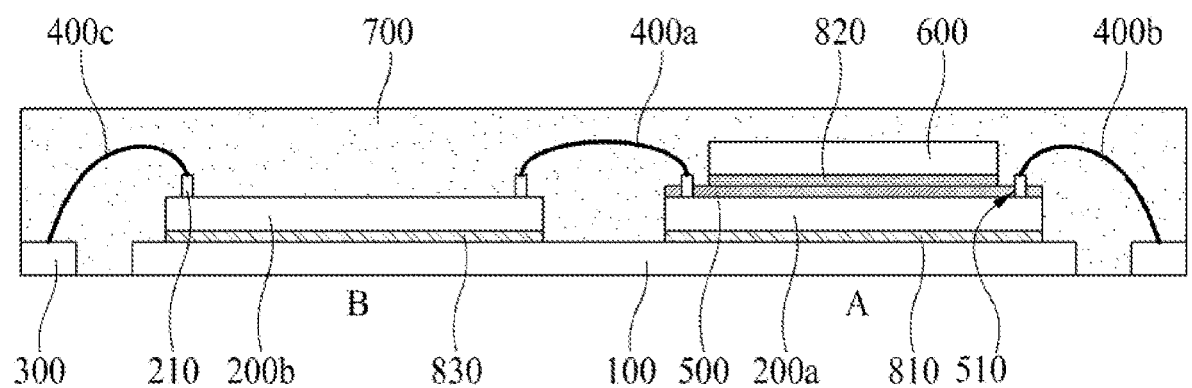
FIG. 6 is a schematic cross-sectional view of a semiconductor package according to still another embodiment of the present invention.

FIG. 6 is a schematic cross-sectional view of a semiconductor package according to still another embodiment of the present invention.

As can be seen in FIG. 6, the semiconductor package according to still another embodiment of the present invention includes a support part 100, semiconductor chips 200a and 200b, a plurality of electrode pads 300, a plurality of wires 400a, 400b, and 400c, a buffer layer 500, a pressure-reducing layer 600, a mold layer 700, and adhesive layers 810, 820, and 830.

The support part 100 is provided below a first semiconductor chip 200a and a second semiconductor chip 200b to support the first semiconductor chip 200a and the second semiconductor chip 200b. Although not shown, a heat sink may be additionally configured on a lower surface of the support part 100 to more easily dissipate heat generated from the semiconductor chip 200 to the outside.

The semiconductor chips 200a and 200b include the first semiconductor chip 200a formed on a first region A of the support part 100 and the second semiconductor chip 200b formed on a second region B of the support part 100.

The first semiconductor chip 200a is fixed to an upper surface of the first region A of the support part 100 by a first adhesive layer 810, and the second semiconductor chip 200b is fixed to an upper surface of the second region B of the support part 100 by a third adhesive layer 830.

A plurality of signal pads 210 are formed in an outer region of an upper surface of each of the first semiconductor chip 200a and the second semiconductor chip 200b. The plurality of signal pads 210 are electrically connected to the plurality of electrode pads 300 through the plurality of wires 400a, 400b, and 400c. The upper surfaces of the plurality of signal pads 210 provided on the first semiconductor chip 200a are exposed without being covered by the buffer layer 500 for connection with a first wire 400a and a second wire 400b. In addition, the upper surfaces of the plurality of signal pads 210 provided on the second semiconductor chip 200b are also exposed for connection with the first wire 400a and a third wire 400c.

The first semiconductor chip 200a is provided with a circuit element that reacts sensitively to external pressing force and thus has a high possibility of generating a signal error due to a piezoelectric phenomenon, and accordingly, the buffer layer 500 and the pressure-reducing layer 600 are provided on the upper surface of the first semiconductor chip 200a. On the other hand, the second semiconductor chip 200b is provided with a circuit element that does not react sensitively to external pressing force and thus has a small or no possibility of generating the signal error due to the piezoelectric phenomenon, and accordingly, the buffer layer 500 and the pressure-reducing layer 600 are not provided on the upper surface of the second semiconductor chip 200b. For example, the first semiconductor chip 200a may comprise an analog front end (AFE), and the second semiconductor chip 200b may comprise a micro controller unit (MCU), but the present invention is not necessarily limited thereto.

The plurality of electrode pads 300 are disposed to be spaced apart from each other in a peripheral region of the semiconductor package. That is, the plurality of electrode pads 300 are provided to be spaced apart from the support part 100 outside the support part 100. In particular, the plurality of electrode pads 300 may be disposed on the outermost line of the semiconductor package. The plurality of electrode pads 300 may be disposed at the same height as the support part 100, but the present invention is not limited thereto.

The plurality of wires 400a, 400b, and 400c connect the plurality of signal pads 210 of the semiconductor chips 200a and 200b with the plurality of electrode pads 300. The plurality of wires 400a, 400b, and 400c includes the first wire 400a, the second wire 400b, and the third wire 400c.

The first wire 400a connects a signal pad 210 provided on one side of the first semiconductor chip 200a, for example, a left side thereof, with a signal pad 210 provided on one side of the second semiconductor chip 200b, for example a right side thereof. The second wire 400b connects a signal pad 210 provided on the other side of the first semiconductor chip 200a, for example, a right side thereof, with an electrode pad 300 provided on one side of the semiconductor package, for example, a right side thereof. The third wire 400c connects a signal pad 210 provided on the other side of the second semiconductor chip 200b, for example, a left side thereof, with an electrode pad 300 provided on one side of the semiconductor package, for example, on a left side thereof.

The buffer layer 500 is provided on the upper surface of the first semiconductor chip 200a. That is, a lower surface of the buffer layer 500 is in contact with the upper surface of the first semiconductor chip 200a.

The buffer layer 500 may be formed on the entire upper surface of the first semiconductor chip 200a except for regions overlapping the plurality of signal pads 210 of the first semiconductor chip 200a. That is, the buffer layer 500 is provided with a first open region 510 in a region of each of the plurality of signal pads 210 of the first semiconductor chip 200a, and one end of the buffer layer 500, for example, a left end thereof, may be consistent with one end of the first semiconductor chip 200a, for example, a left end thereof, and the other end of the buffer layer 500, for example, a right end thereof, may be consistent with the other end of the first semiconductor chip 200a, for example, a right end thereof. The first open region 510 is formed to pass through from an upper surface to the lower surface of the buffer layer 500. In addition, in order to facilitate the connection between the plurality of signal pads 210 and the first and second wires 400a and 400b, a thickness of the buffer layer 500 may be configured to be smaller than a thickness of the signal pad 210 of the first semiconductor chip 200a, and accordingly, the upper surface of the signal pad 210 may be formed at a position higher than the upper surface of the buffer layer 500.

The pressure-reducing layer 600 is formed on the buffer layer 500 and is fixed to the upper surface of the buffer layer 500 by a second adhesive layer 820. The pressure-reducing layer 600 is formed not to overlap the plurality of signal pads 210 of the first semiconductor chip 200a. Therefore, one end of the pressure-reducing layer 600, for example, a left end thereof, is not consistent with one end of each of the buffer layer 500 and the first semiconductor chip 200a, for example, the left end thereof, and the other end of the pressure-reducing layer 600, for example, a right end thereof, is not consistent with the other end of each of the buffer layer 500 and the first semiconductor chip 200a, for example, the right end thereof.

It may be preferable that a thickness of the pressure-reducing layer 600 is half of a thickness of the first semiconductor chip 200a or more and is equal to or less than the thickness of the first semiconductor chip 200a. Specifically, it may be preferable that the thickness of the pressure-reducing layer 600 ranges from 200 μm to 500 μm.

The mold layer 700 is formed on the support part 100, the first and second semiconductor chips 200a and 200b, the plurality of electrode pads 300, the first to third wires 400a, 400b, and 400c, the buffer layer 500, and the pressure-reducing layer 600.

The adhesive layers 810, 820, and 830 include the first adhesive layer 810, the second adhesive layer 820, and the third adhesive layer 830. The first adhesive layer 810 is provided between the support part 100 and the first semiconductor chip 200a to adhere the first semiconductor chip 200a to the support part 100. The second adhesive layer 820 is provided between the buffer layer 500 and the pressure-reducing layer 600 to adhere the pressure-reducing layer 600 to the buffer layer 500. The third adhesive layer 830 is provided between the support part 100 and the second semiconductor chip 200b to adhere the second semiconductor chip 200b to the support part 100.

The second adhesive layer 820 is formed so as not to overlap the plurality of signal pads 210 of the first semiconductor chip 200a. Therefore, one end of the second adhesive layer 820, for example, a left end thereof, is not consistent with one end of each of the buffer layer 500 and the first semiconductor chip 200a, and the other end of the second adhesive layer 820, for example, a right end thereof, is not consistent with the other end of each of the buffer layer 500 and the first semiconductor chip 200a, for example, the right end thereof. The second adhesive layer 820 may be formed in the same pattern as the pressure-reducing layer 600.

As described above, according to still another embodiment of the present invention, by separating the circuit element that reacts sensitively to external pressing force and thus has a high possibility of generating the signal error due to the piezoelectric phenomenon and the circuit element that has a small or no possibility of generating the signal error, and forming the buffer layer 500 and the pressure-reducing layer 600 only on the upper surface of the first semiconductor chip 200a including the circuit element that has a high possibility of generating the signal error among the plurality of semiconductor chips 200a and 200b formed on the support part 100, it is possible to minimize the process addition and cost increase caused by the formation of the buffer layer 500 and the pressure-reducing layer 600.

However, in some cases, it is also possible to form the buffer layer 500 and the pressure-reducing layer 600 on the upper surface of the second semiconductor chip 200b, which has a small possibility of generating the signal error.

Meanwhile, although not specifically shown, the configurations of the buffer layer 500 and the second adhesive layer 820 formed on the upper surface of the first semiconductor chip 200a may be variously changed as shown in FIGS. 3 to 5 described above. That is, a second open region 520 may be additionally provided in the buffer layer 500 and a pore H may be formed in the second open region 520 as shown in FIG. 3, and the pore H may not be formed in the second open region 520 because the pore H is completely filled by the second adhesive layer 820 as shown in FIG. 4, and a part of the second open regions 520 may be filled with the second adhesive layer 820, and at least one pore H may be formed in the remaining part of the second open region 520 as shown in FIG. 5.

Figure 7A:
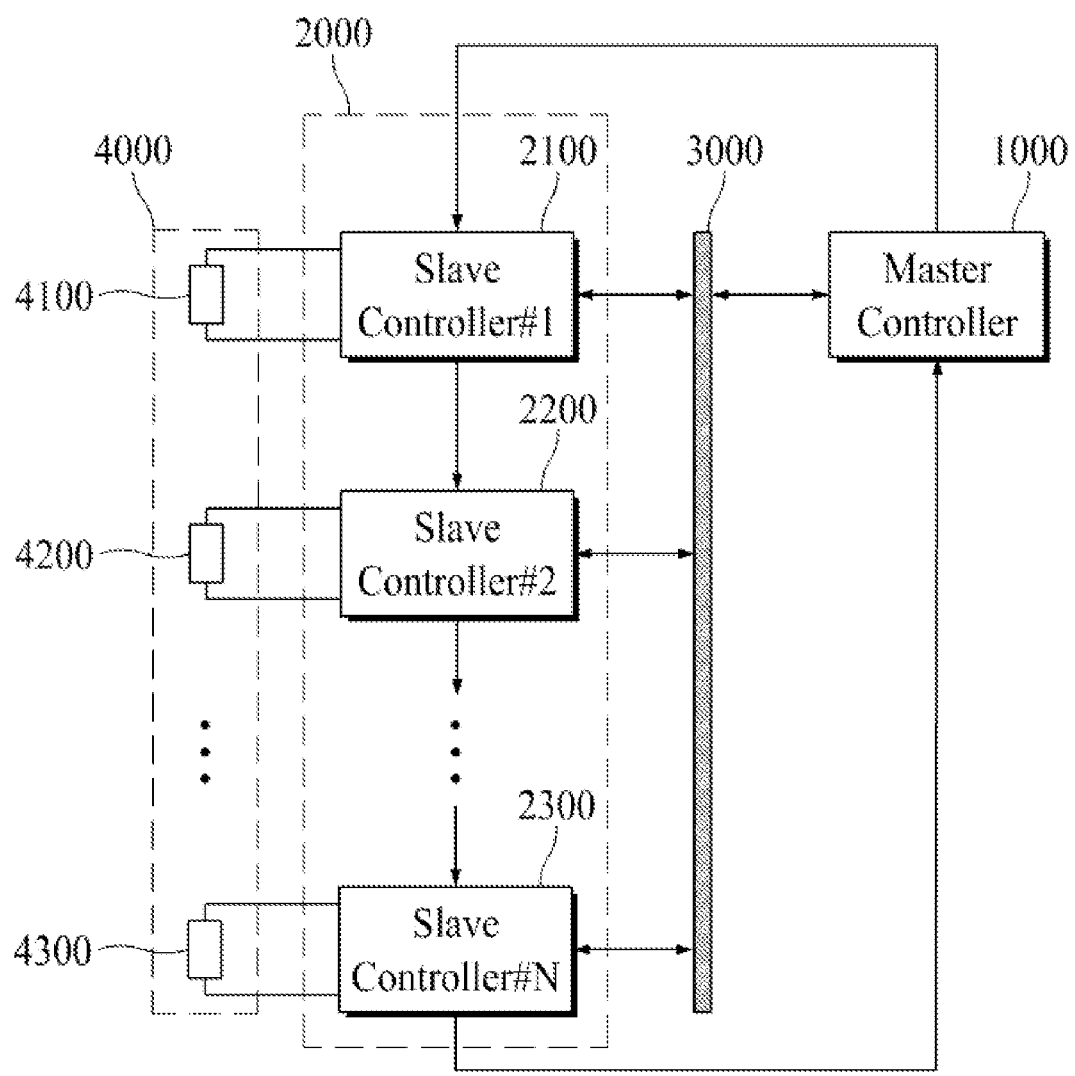
FIG. 7A is a block diagram of a battery management system that may be applied to the semiconductor package of the present invention.
Figure 7B:
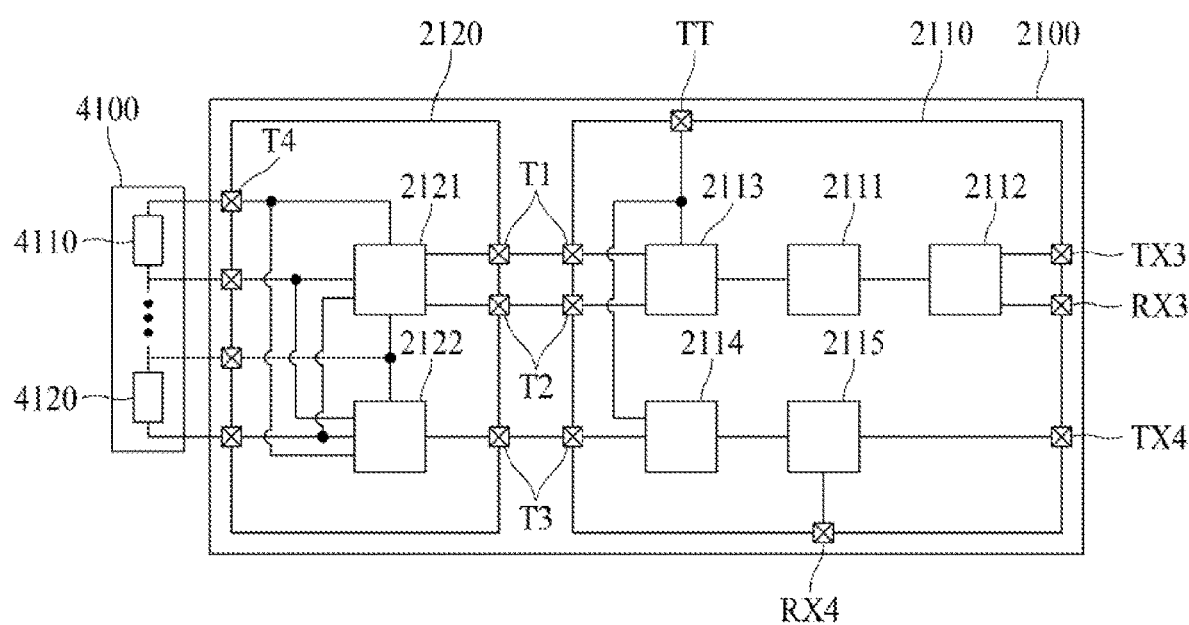
FIG. 7B is a block diagram of a slave controller of the battery management system that may be applied to the semiconductor package of the present invention.

FIG. 7A is a block diagram of a battery management system that may be applied to the semiconductor package of the present invention, and FIG. 7B is a block diagram of a slave controller of the battery management system that may be applied to the semiconductor package of the present invention.

As can be seen in FIG. 7A, the battery management system (BMS) includes a master controller 1000, a slave controller group 2000, a bus line 3000, and a battery cell group 4000.

The slave controller group 2000 may include first to Nth (N is a positive integer of 2 or more) slave controllers 2100, 2200, and 2300, and the battery cell group 4000 may include first to Nth battery cells 4100, 4200, and 4300.

The master controller 1000 is connected in parallel to the first to Nth slave controllers 2100, 2200, and 2300 through a first communication channel. The first communication channel may include the bus line 3000 disposed between the master controller 1000 and the slave controller group 2000. That is, the master controller 1000 and the first to Nth slave controllers 2100, 2200, and 2300 may share the bus line 3000. In this case, the master controller 1000 may communicate with the first to Nth slave controllers 2100, 2200, and 2300 through the bus line 3000 by controller area network (CAN) communication.

The master controller 1000 may bi-directionally communicate with each of the first to Nth slave controllers 2100, 2200, and 2300 through the first communication channel. For example, the master controller 1000 may control battery cell balancing by bidirectional communication with the first to Nth slave controllers 2100, 2200, and 2300. Specifically, each of the first to Nth slave controllers 2100, 2200, and 2300 may transmit voltage information data and temperature information data of the battery cell to the master controller 1000. In this case, the master controller 1000 may analyze the voltage information data and the temperature information data of each of the first to Nth battery cells 4100, 4200, and 4300 to calculate cell balancing information data for balancing of the first to Nth battery cells 4100, 4200, and 4300. Then, the master controller 1000 may transmit the cell balancing information data to each of the first to Nth slave controllers 2100, 2200, and 2300. Each of the first to Nth slave controllers 2100, 2200, and 2300 may perform the battery cell balancing according to the cell balancing information data.

In addition, the master controller 1000 may analyze the voltage information data and the temperature information data of each of the first to Nth battery cells to calculate a state of charge (SOC), a state of health (SOH), and safety information of each of the first to Nth battery cells. The master controller 1000 may control a switching unit switching the connection between the first to Nth battery cells 4100, 4200, and 4300 and a power source or load according to the state of charge (SOC), the state of health (SOH), and the safety information to control charging and discharging of each of the first to Nth battery cells.

The master controller 1000 is serially connected to the first to Nth slave controllers 2100, 2200, and 2300 through a second communication channel in a daisy chain method. That is, the master controller 1000 may be connected to the first to Nth slave controllers 2100, 2200, and 2300 in a ring structure as shown in FIG. 7A.

The master controller 1000 may receive an instruction signal via the first to Nth slave controllers 2100, 2200, and 2300 through the second communication channel. The instruction signal may be a signal instructing the safety information of the first to Nth battery cells. When a first instruction signal is input, the master controller 1000 may determine that the voltage and temperature of the first to Nth battery cells 4100, 4200, and 4300 are normal, and when a second instruction signal is input, the master controller 1000 may determine that the voltage and temperature of at least one of the first to Nth battery cells are abnormal.

The master controller 1000 collectively controls a battery management system (BMS), and thus may be referred to as a battery master controller, and each of the first to Nth slave controllers 2100, 2200, and 2300 controls the first to Nth battery cells, and thus may be referred to as a cell module controller.

The battery cell group 4000 may include the first to Nth battery cells 4100, 4200, and 4300. Each of the first to Nth battery cells 4100, 4200, and 4300 may include a secondary battery capable of charging and discharging. For example, the secondary battery of each of the first to Nth battery cells 4100, 4200, and 4300 may be implemented as any one of a nickel-cadmium (Ni—Cd) battery, a nickel-hydrogen (Ni—H) battery, and a lithium (Li) battery, but the present invention is not limited thereto. Each of the first to Nth battery cells 4100, 4200, and 4300 may include a plurality of secondary batteries, and in this case, the secondary batteries may be connected in series.

As described above, according to an embodiment of the present invention, the master controller 1000 communicates with the plurality of slave controllers 2100, 2200, and 2300 using a plurality of communication channels, for example, the first communication channel and the second communication channel. As a result, even though a problem occurs in the first communication channel corresponding to a main communication channel, the master controller 1000 may receive an instruction signal instructing whether the voltage and temperature of at least one of the first to Nth battery cells 4100, 4200, and 4300 are normal or abnormal through the second communication channel corresponding to a sub communication channel.

As can be seen in FIG. 7B, the battery management system according to an embodiment of the present invention includes a first slave controller 2100 and a first battery cell 4100.

The first slave controller 2100 includes a microcontroller 2110 and a voltage sensing unit 2120. In this case, the microcontroller 2110 may be formed of the first semiconductor chip 200a of FIG. 6 described above, and the voltage sensing unit 2120 may be formed of the second semiconductor chip 200b of FIG. 6 described above.

The microcontroller 2110 receives a first sensing voltage and a second sensing voltage from the voltage sensing unit 2120 and receives a sensing temperature of the first battery cell 4100 from a temperature reception terminal TT. The microcontroller 2110 converts the first sensing voltage into voltage information data that is digital data and converts the sensing temperature into temperature information data that is digital data to transmit the converted data to the master controller through the first communication channel. The microcontroller 2110 determines whether the first battery cell 4100 is overcharged, overdischarged, or overheated based on the second sensing voltage and the sensing temperature and transmits the instruction signal to a second slave controller 2200.

Specifically, the microcontroller 2110 may include a central processing unit 2111, a communication module 2112, an analog-to-digital converter 2113, a comparator 2114, and an instruction signal output unit 2115.

The central processing unit 2111 receives the voltage information data and the temperature information data from the analog-to-digital converter 2113. The central processing unit 2111 outputs the voltage information data and the temperature information data to the communication module 2112 in order to transmit the voltage information data and the temperature information data to the master controller 1000 through the first communication channel. In addition, the central processing unit 2111 receives control information data from the communication module 2112 and controls the first battery cell 4100 according to the control information data. For example, the central processing unit 2111 may receive cell balancing data as an example of the control information data to control cell balancing of the first battery cell 4100 according to the cell balancing data. In this case, the first slave controller 2100 may further include a cell balancing unit connected to the first battery cell 4100. The cell balancing unit may include switches for forming a discharge path in each of the secondary batteries of the first battery cell 4100. The central processing unit 2111 may output switch signals for controlling the switches of the cell balancing unit according to the cell balancing information data to the cell balancing unit.

The communication module 2112 is a module for communicating with the master controller 1000 through the first communication channel. The communication module 2112 converts the voltage information data and the temperature information data received from the central processing unit 2111 into a communication packet suitable for the first communication channel to transmit the converted packet to the master controller 1000 through a third transmission terminal TX3. In addition, the communication module 2112 converts the communication packet transmitted from the master controller 1000 through a third reception terminal RX3 into control information data to output the converted data to the central processing unit 2111.

The analog-to-digital converter 2113 receives the first sensing voltage from the voltage sensing unit 2120 through first and second terminals T1 and T2 and receives the sensing temperature of the first battery cell 4100 through the temperature reception terminal TT. The analog-to-digital converter 2113 converts the first sensing voltage into voltage information data that is digital data and converts the sensing temperature into temperature information data that is digital data. The analog-to-digital converter 2113 outputs the voltage information data and the temperature information data to the central processing unit 2111.

The comparator 2114 receives the second sensing voltage from the voltage sensing unit 2120 through a third terminal T3 and receives the sensing temperature of the first battery cell 4100 through the temperature reception terminal TT. The comparator 2114 compares the second sensing voltage with a first voltage threshold value and a second voltage threshold value, compares the sensing temperature with a first temperature threshold value and a second temperature threshold value and then outputs a comparison signal according to the comparison result.

Specifically, the comparator 2114 outputs a first comparison signal when the second sensing voltage has a value between the first voltage threshold value and the second voltage threshold value and the sensing temperature has a value between the first temperature threshold value and the second temperature threshold value. The comparator 2114 outputs a second comparison signal when the second sensing voltage has a value greater than or equal to the first voltage threshold value or less than or equal to the second voltage threshold value, or when the sensing temperature has a value greater than or equal to the first temperature threshold value or less than or equal to the second temperature threshold value.

The first voltage threshold value may be a voltage threshold value that is a reference for overcharging of the first battery cell 4100, and the second voltage threshold value may be a voltage threshold value that is a reference for over-discharging of the first battery cell 4100. The first voltage threshold value may be greater than the second voltage threshold value. In addition, the first temperature threshold value may be a temperature threshold value that is a reference for overheating of the first battery cell 4100, and the second temperature threshold value may be a temperature threshold value that is a reference of a low temperature of the first battery cell 4100. The first temperature threshold value may be greater than the second temperature threshold value.

The instruction signal output unit 2115 outputs the instruction signal to a fourth transmission terminal TX4 according to the instruction signal transmitted through a fourth reception terminal RX4 and the comparison signal from the comparator 2114. In addition, the instruction signal output unit 2115 outputs the second instruction signal to the fourth transmission terminal TX4 without change when the second instruction signal is input through the fourth reception terminal RX4.

The voltage sensing unit 2120 may include a first voltage sensing unit 2121 and a second voltage sensing unit 2122. Each of the first and second voltage sensing units 2121 and 2122 is connected to both ends of the first battery cell 4100 to sense a voltage of the battery cell 4100. For example, each of the first and second voltage sensing units 2121 and 2122 may be connected to both ends of each of the secondary batteries of the first battery cell 4100 through fourth terminals T4, thereby sensing a voltage of each of secondary batteries 4110 and 4120.

The first voltage sensing unit 2121 outputs at least one sensing voltage sensed from the first battery cell 4100 to the analog-to-digital converter 2113 through the first and second terminals T1 and T2 as the first sensing voltage. The first voltage sensing unit 2121 may transmit the first sensing voltage to the analog-to-digital converter 2113 in a form of a differential signal using two signal lines.

The second voltage sensing unit 2122 outputs at least one sensing voltage sensed from the first battery cell 4100 to the comparator 2114 through the third terminal T3 as the second sensing voltage. The second voltage sensing unit 2122 may transmit the second sensing voltage to the comparator 2114 using one signal line.

The first sensing voltage is converted into voltage information data by the analog-to-digital converter 2113 and transmitted to the master controller 1000 through the first communication channel, whereas the second sensing voltage is compared with the first voltage threshold value and the second voltage threshold value in the comparator 2114. That is, the first sensing voltage is a value used to analyze the cell balancing, the state of charge (SOC), the state of health (SOH), and the safety information in the master controller 1000, but the second sensing voltage is a value to be compared with the first voltage threshold value corresponding to an upper limit threshold value and the second voltage threshold value corresponding to a lower limit threshold value. Therefore, it is important to transmit the first sensing voltage more accurately than the second sensing voltage. Accordingly, according to an embodiment of the present invention, the first sensing voltage may be transmitted with a more accurate value than when transmitting using one signal line by transmitting the first sensing voltage to the analog-to-digital converter 2113 in the form of the differential signal using two signal lines. In addition, according to an embodiment of the present invention, circuit complexity may be lowered and costs may be reduced by transmitting the second sensing voltage using one signal line.

The embodiments of the present invention have been described in more detail with reference to the accompanying drawings, but the present invention is not necessarily limited to these embodiments and may be variously modified without departing from the technological spirit of the present invention. Therefore, the embodiments disclosed in the present invention are not intended to limit the technological spirit of the present invention, but the embodiments are intended to describe, and the scope of the technological spirit of the present invention is not limited by such embodiments. Therefore, it should be understood that the embodiments described above are illustrative in all respects and not restrictive. The protection scope of the present invention should be construed by the claims, and all technological spirits within the equivalent scope thereof should be construed as being included in the scope of rights of the present invention.

What is claimed is:

1. A semiconductor package comprising:
a support part;
a semiconductor chip provided on the support part and including a plurality of signal pads;
a buffer layer provided on the semiconductor chip;
an adhesive layer provided on the buffer layer;
a pressure-reducing layer provided on the adhesive layer; and
a mold layer provided on the pressure-reducing layer.

2. The semiconductor package of claim 1, wherein the buffer layer includes a first open region in a region corresponding to each of the plurality of signal pads so that upper surfaces of the plurality of signal pads are exposed.

3. The semiconductor package of claim 2, wherein a thickness of the buffer layer is smaller than that of each of the plurality of signal pads, and a height of the upper surface of each of the plurality of signal pads is greater than that of an upper surface of the buffer layer.

4. The semiconductor package of claim 1, wherein one end of the buffer layer is consistent with one end of the semiconductor chip, and the other end of the buffer layer is consistent with the other end of the semiconductor chip.

5. The semiconductor package of claim 1, wherein the adhesive layer and the pressure-reducing layer do not overlap the plurality of signal pads, and
one end of each of the adhesive layer and the pressure-reducing layer is not consistent with one end of the semiconductor chip, and the other end of each of the adhesive layer and the pressure-reducing layer is not consistent with the other end of the semiconductor chip.

6. The semiconductor package of claim 1, wherein a thickness of the pressure-reducing layer is half of a thickness of the semiconductor chip or more and less than or equal to the thickness of the semiconductor chip.

7. The semiconductor package of claim 1, wherein a deviation between a thermal expansion coefficient of the pressure-reducing layer and a thermal expansion coefficient of the semiconductor chip is within ±10.

8. The semiconductor package of claim 1, wherein a thickness of the pressure-reducing layer ranges from 200 μm to 500 μm, and a thermal expansion coefficient of the pressure-reducing layer ranges from 2.6 ppm/° C. to 3.0 ppm/° C.

9. The semiconductor package of claim 1, wherein the semiconductor chip includes a first circuit region and a second circuit region, and
the buffer layer includes a second open region in a region corresponding to the first circuit region.

10. The semiconductor package of claim 9, wherein a pore is provided in the second open region.

11. The semiconductor package of claim 9, wherein the second open region is filled with the adhesive layer.

12. The semiconductor package of claim 9, wherein a band gap reference circuit or an amplifier circuit is provided in the first circuit region.

13. The semiconductor package of claim 1, wherein a thickness of the adhesive layer is greater than a thickness of the buffer layer.

14. A semiconductor package comprising:
a support part;
a first semiconductor chip and a second semiconductor chip provided on the support part and each including a plurality of signal pads;
a plurality of electrode pads provided to be spaced apart from the support part outside the support part;
a wire including a first wire connecting one of the signal pads of the first semiconductor chip and one of the signal pads of the second semiconductor chip, a second wire connecting another signal pad of the first semiconductor chip and one of the electrode pads, and a third wire connecting another signal pad of the second semiconductor chip and another electrode pad;
a buffer layer provided on the first semiconductor chip;
an adhesive layer provided on the buffer layer;
a pressure-reducing layer provided on the adhesive layer; and
a mold layer provided on the pressure-reducing layer.

15. The semiconductor package of claim 14, wherein the buffer layer and the pressure-reducing layer are not provided on the second semiconductor chip.

16. The semiconductor package of claim 14, wherein the buffer layer includes a first open region in a region corresponding to each of the plurality of signal pads so that upper surfaces of the plurality of signal pads are exposed, and
a thickness of the buffer layer is smaller than a thickness of each of the plurality of signal pads, and a height of the upper surface of each of the plurality of signal pads is greater than a height of an upper surface of the buffer layer.

17. The semiconductor package of claim 14, wherein one end of the buffer layer is consistent with one end of the first semiconductor chip, and the other end of the buffer layer is consistent with the other end of the first semiconductor chip, the adhesive layer and the pressure-reducing layer do not overlap the plurality of signal pads, and
one end of each of the adhesive layer and the pressure-reducing layer is not consistent with one end of the first semiconductor chip, and the other end of each of the adhesive layer and the pressure-reducing layer is not consistent with the other end of the first semiconductor chip.

18. The semiconductor package of claim 14, wherein a thickness of the pressure-reducing layer is half of a thickness of the first semiconductor chip or more and less than or equal to the thickness of the first semiconductor chip, and
a deviation between a thermal expansion coefficient of the pressure-reducing layer and a thermal expansion coefficient of the first semiconductor chip is within ±10.

19. The semiconductor package of claim 14, wherein the first semiconductor chip includes a first circuit region and a second circuit region, and
the buffer layer includes a second open region in a region corresponding to the first circuit region.

20. The semiconductor package of claim 14, wherein a thickness of the adhesive layer is greater than a thickness of the buffer layer.

21. A battery management system comprising a semiconductor package, wherein the semiconductor package includes:
a support part;
a first semiconductor chip and a second semiconductor chip provided on the support part and each including a plurality of signal pads;
a plurality of electrode pads provided to be spaced apart from the support part outside the support part;
a wire including a first wire connecting one of the signal pads of the first semiconductor chip and one of the signal pads of the second semiconductor chip, a second wire connecting another signal pad of the first semiconductor chip and one of the electrode pads, and a third wire connecting another signal pad of the second semiconductor chip and another electrode pad;
a buffer layer provided on the first semiconductor chip;
an adhesive layer provided on the buffer layer;
a pressure-reducing layer provided on the adhesive layer; and
a mold layer provided on the pressure-reducing layer,
wherein the second semiconductor chip is provided with a voltage sensing unit, and the first semiconductor chip is provided with a microcontroller that receives a sensing voltage from the voltage sensing unit and converts the sensing voltage into voltage information data that is digital data to transmit the voltage information data to a master controller.

22. The battery management system of claim 21, wherein the microcontroller provided in the first semiconductor chip includes an analog-to-digital converter that converts a first sensing voltage received from the voltage sensing unit into voltage information data that is digital data, a communication module configured to communicate with the master controller, a central processing unit configured to receive control information data from the communication module and control a battery cell according to the control information data, a comparator configured to receive a second sensing voltage from the voltage sensing unit and compare the second sensing voltage with a threshold voltage value, and an instruction signal output unit configured to output an instruction signal according to a comparison signal from the comparator.

* * * * *